(12) United States Patent
Shan et al.

(10) Patent No.: US 8,115,096 B2
(45) Date of Patent: Feb. 14, 2012

(54) METHODS AND APPARATUSES FOR IMPROVING POWER EXTRACTION FROM SOLAR CELLS

(75) Inventors: Wei Shan, Fremont, CA (US); Zitong Chen, Saratoga, CA (US)

(73) Assignee: E-Cube Technologies, Ltd., Saratoga, CA (US)

( * ) Notice: Subject to any disclaimer, the term of this patent is extended or adjusted under 35 U.S.C. 154(b) by 487 days.

(21) Appl. No.: 12/141,546

(22) Filed: Jun. 18, 2008

(65) Prior Publication Data
US 2009/0114276 A1 May 7, 2009

Related U.S. Application Data

(60) Provisional application No. 60/934,871, filed on Jun. 18, 2007.

(51) Int. Cl.
*H01L 31/0224* (2006.01)
(52) U.S. Cl. .......................................... 136/256; 438/98
(58) Field of Classification Search .......... 136/243–265; 438/98
See application file for complete search history.

(56) References Cited

U.S. PATENT DOCUMENTS

| | | | |
|---|---|---|---|
| 4,395,583 A | 7/1983 | Meulenberg | |
| 4,419,530 A | 12/1983 | Nath | |
| 4,478,879 A | 10/1984 | Baraona et al. | |
| 4,638,111 A | 1/1987 | Gay | |
| 6,441,297 B1 * | 8/2002 | Keller et al. | 136/249 |
| 2001/0017153 A1 | 8/2001 | Kubota et al. | |
| 2001/0035206 A1 | 11/2001 | Inamasu et al. | |
| 2005/0172996 A1 | 8/2005 | Hacke et al. | |
| 2005/0253142 A1 | 11/2005 | Negami et al. | |

FOREIGN PATENT DOCUMENTS

| | | |
|---|---|---|
| WO | WO 2006/123938 | 11/2006 |
| WO | WO 2008/157577 | 12/2008 |

OTHER PUBLICATIONS

International Search Report and Written Opinion dated Dec. 22, 2008 issued in WO/2008/157577 (PCT/US2008/067293).
International Preliminary Report on Patentability dated Dec. 22, 2009 issued in WO/2008/157577 (PCT/US2008/067293).
Kerschaver et al. (2006) "Back-contact Solar Cells: A Review" *Prog. Photovolt: Res. Appl.* 14:107-123.

* cited by examiner

*Primary Examiner* — Basia Ridley
*Assistant Examiner* — Christina Chern
(74) *Attorney, Agent, or Firm* — Tom Hunter; Weaver Austin Villeneuve & Sampson LLP

(57) ABSTRACT

The field of the invention relates to minimization of resistive loss of solar panels in order to achieve maximum solar energy conversion efficiency, extracting more electricity power from available solar irradiance. Schemes are designed to take advantage of the geometrical and mechanical configurations of back contact solar cells to make better electrical contacts and connections so as to achieve maximum solar energy conversion efficiency and better power extraction.

9 Claims, 11 Drawing Sheets

METHODS AND APPARATUSES FOR IMPROVING POWER EXTRACTION FROM SOLAR CELLS

This application claims the priority of U.S. Provisional Patent Application No. 60/934,871, filed Jun. 18, 2007.

BACKGROUND OF THE INVENTION

1. Field of the Invention

Embodiments of the present invention are directed to the field of photovoltaics (PV) technology that converts solar energy directly into electrical energy. The field of the invention is specifically directed to minimization of resistive loss of solar panels in order to achieve maximum solar energy conversion efficiency, extracting more electrical power from available solar irradiance.

2. Description of the Related Art

Practical solar cells have a number of limits including reflection, contact shadowing, series resistance, incomplete collection of photogenerated carriers, absorption in the inactive window layers, nonradiative recombination, etc. that can affect energy conversion efficiency. Among them, energy losses arising from ohmic resistance of the metal grid of the back contact of solar cells and of the electrical connections between the cells installed on a solar module may cause significant decrease in solar conversion efficiency and less power extraction than it should be. The primary sources of the electrical resistances that may contribute to energy losses include metallization, shadowing, as well as electrical wiring.

The resistance of the metallization is very critical to the conversion efficiency of a solar cell. Usually, the sheet resistivity $\rho_s$ of the diffused surface layer dominates the resistivity losses for current flowing in the surface of the cell. The sheet loss resulted from the fingers of a metal grid on a cell surface is given by $$P_s = S^2 \rho_s J_o^2, \quad (1)$$

where S is the spacing between parallel fingers that form a metal grid on the surface of a solar cell, $J_o$ is the current density. This is valid generally when the spacing between the parallel fingers of a metal grid on a solar cell is large comparing to their width.

The resistance of the metal grids that are in direct contact with the surfaces of solar cells may affect conversion efficiency drastically. The resistive loss from a rectangular metal finger of resistivity $\rho_m$ is proportional to its length to the power of three as given by (H. B. Serreze, Proc. 13$^{th}$ IEEE Photovoltaic Spec. Conf. (IEEE, New York, 1978), p. 609):

$$P_m = WL^3 S \rho_m J_o^2 / 3D, \quad (2)$$

Where W is the width of a rectangular cell, L is the finger length on the cell, and D is the width of the finger.

The shadowing loss due to the metal grid on the surface of a solar cell is, in addition to the geometrical parameters of the metal fingers on a cell, proportional to the maximum power voltage $$P_s = WLJ_o V_{mp} D/S. \quad (3)$$

The optimum finger width can be derived from minimizing the sum of $P_m$ and $P_s$, $$D_o = LSJ_o(\rho_m/3V_{mp})^{1/2}, \quad (4)$$

and for which the total power loss is $$P_T = 2WL^2(\rho_m J_o^3 V_{mp}/3)^{1/2}. \quad (5)$$

These extrinsic sources of energy loss, in principle, can be minimized, if not eliminated. The back contact structure developed in the past that has put both polarities of contacts on the backside of a solar cell (FIG. 1) gets rid of the front metal grid therefore completely eliminates the shadowing loss. It also reduces the series resistance of metal grid because the contacts can be very broad covering almost entire back surface. These structures are generally called back-contact solar cells are disclosed, e.g., in U.S. Pat. No. 4,478,879 and Van Kerschaver et al. (Back-contact Solar Cells: A Review. Prog. Photovolt: Res. Appl. 2006, 14:107-123).

Since the resistance of metal fingers is proportional to L/D, there is still a relatively large resistance that may cause considerably energy loss because the connection bus for both electrical polarities of a back-contact solar cell is at the opposite edges. Energy loss is inevitable when current flows through those narrow and thin fingers across almost entire length of the cell. It is obvious that shortening the length of metal fingers on the surface of solar cells or increasing the thickness of the fingers may further reduce the energy loss due to series resistance can definitely reduce such a loss. However, it is rather difficult to realize all these on the cell level due to various constrains associated with materials properties and related to production process and manufacturing cost issues.

SUMMARY OF THE INVENTION

In this invention, methods and apparatuses based on the consideration of minimizing ohmic resistances associated with solar cells installed in modules are provided for the purposes of reducing the energy losses stemmed from electrical resistance and maximizing solar energy conversion efficiency. A number of schemes are designed to take advantage of the geometrical and mechanical configurations of solar cells with both polarities of metal contacts on the back surface (back-contact solar cells) to make better electrical contacts and connections so as to achieve maximum solar energy conversion efficiency and better power extraction.

DETAILED DESCRIPTION OF THE INVENTION

Figure 1:
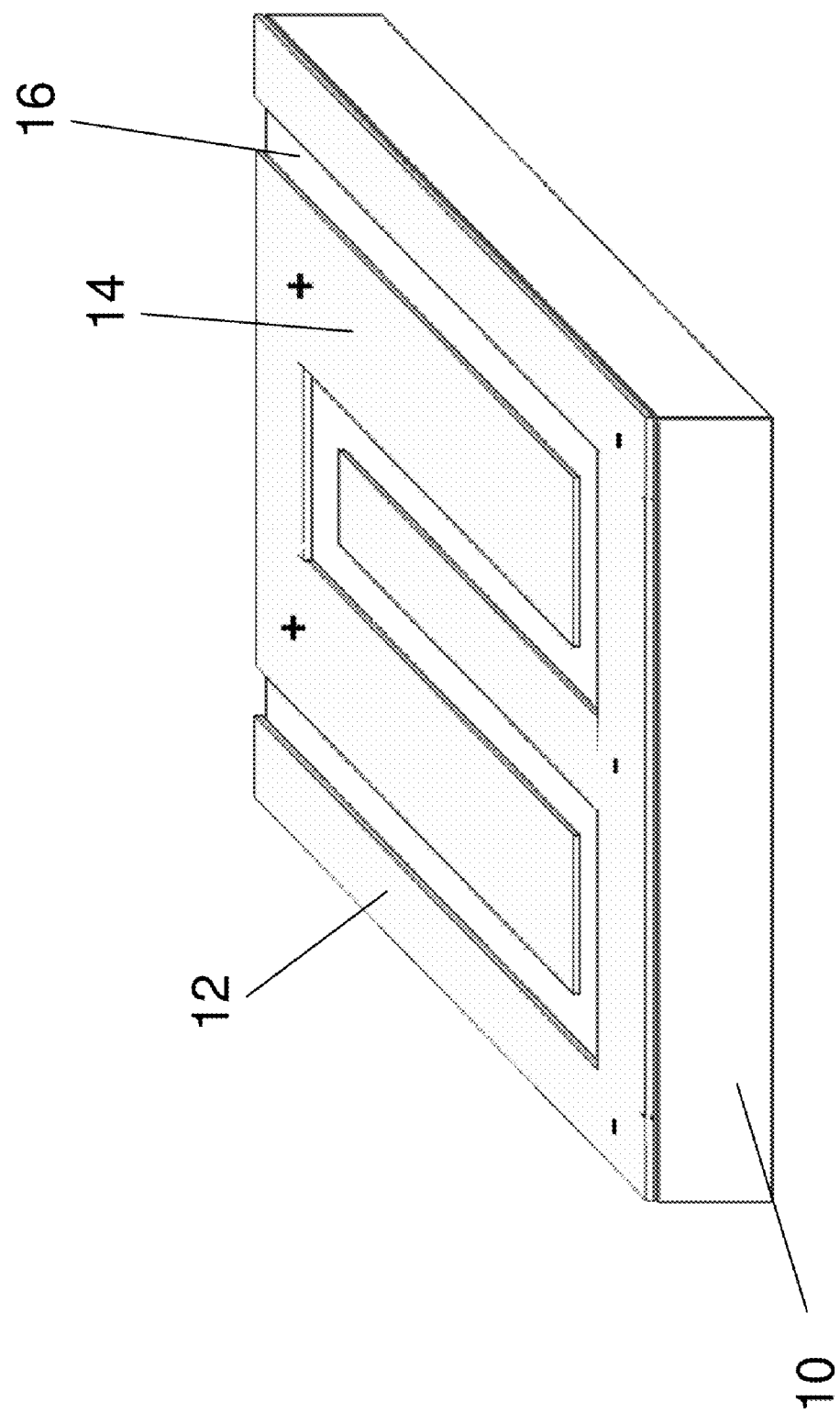
FIG. 1 is a schematic illustration of conceptual back contacts on a solar cell with interleaved metal fingers of both polarities (a back-contact solar cell)

The foregoing background and summary, as well as the following detailed description of the drawings, will be better understood when read in conjunction with the appended drawings. For the purpose of illustrating the invention, there is shown in the drawings embodiments which are presently preferred. It should be understood, however, that the invention is not limited to the precise arrangements and instrumentalities shown. Throughout the drawings, like reference numerals refer to like elements. The terms "front" and "back" are used to distinguish between the different surfaces of an element. The use of the terms does not mean that the "front" surface always comes before the "back" surface. Either position is considered to be within the scope of the invention.

Disclosed herein are schemes designed to utilize the geometrical configuration and mechanical structure of back contact solar cells to minimize energy losses resulted from ohmic resistances related to solar cells used in modules so as to achieve maximum solar conversion efficiency for electricity power extraction. This may be accomplished using unique designs disclosed in this invention that bridges electrical connection between back-contact solar cells on a modular level.

Figure 2A:
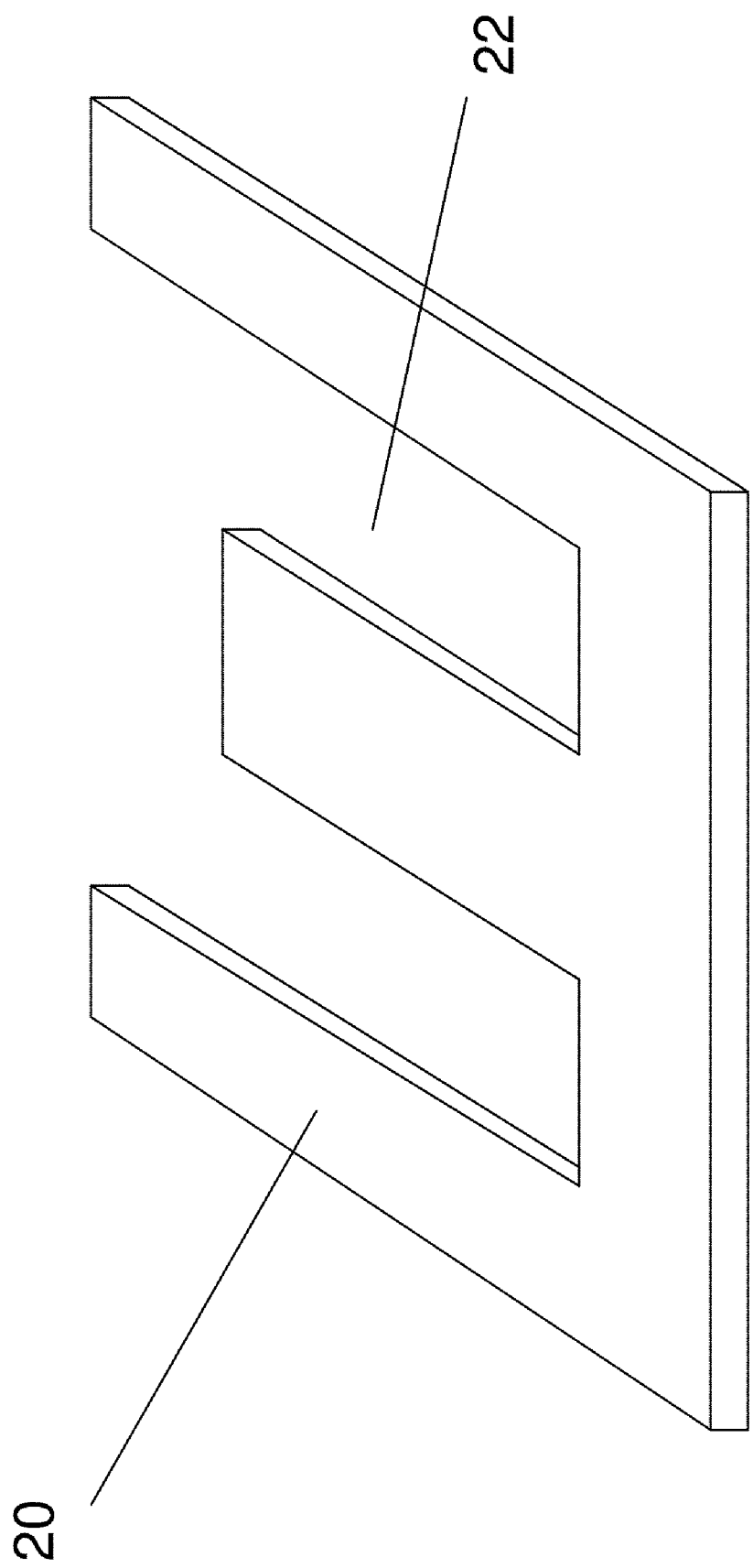
FIG. 2a is a schematic illustration of an exemplary example of metal sheet with openings that matches the geometrical configuration of one set of metal fingers of a back-contact solar cell.

In one embodiment to reduce energy loss arising from ohmic resistance of thin, narrow metal fingers on a back-contact solar cell, one metal sheet of excellent electrical conduction (first conductive layer) (20) may be used to make immediate electrical contact to the entire metal-finger grid of one type (polarity) contact (12) on the back surface (16) of a back-contact solar cell, rather than only connecting electrical leads to the connection bus located on the two opposite edges of a back-contact solar cell. Referring to FIG. 2*a*, the metal sheet (20) has a number of openings (22) matching to the metal finger pattern of another type (opposite polarity, referring to FIG. 1) contact (14) and leaving enough space to ensure good electrical separation between the sheet (20) and those metal fingers of opposite polarity (14) on the cell.

Figure 2B:
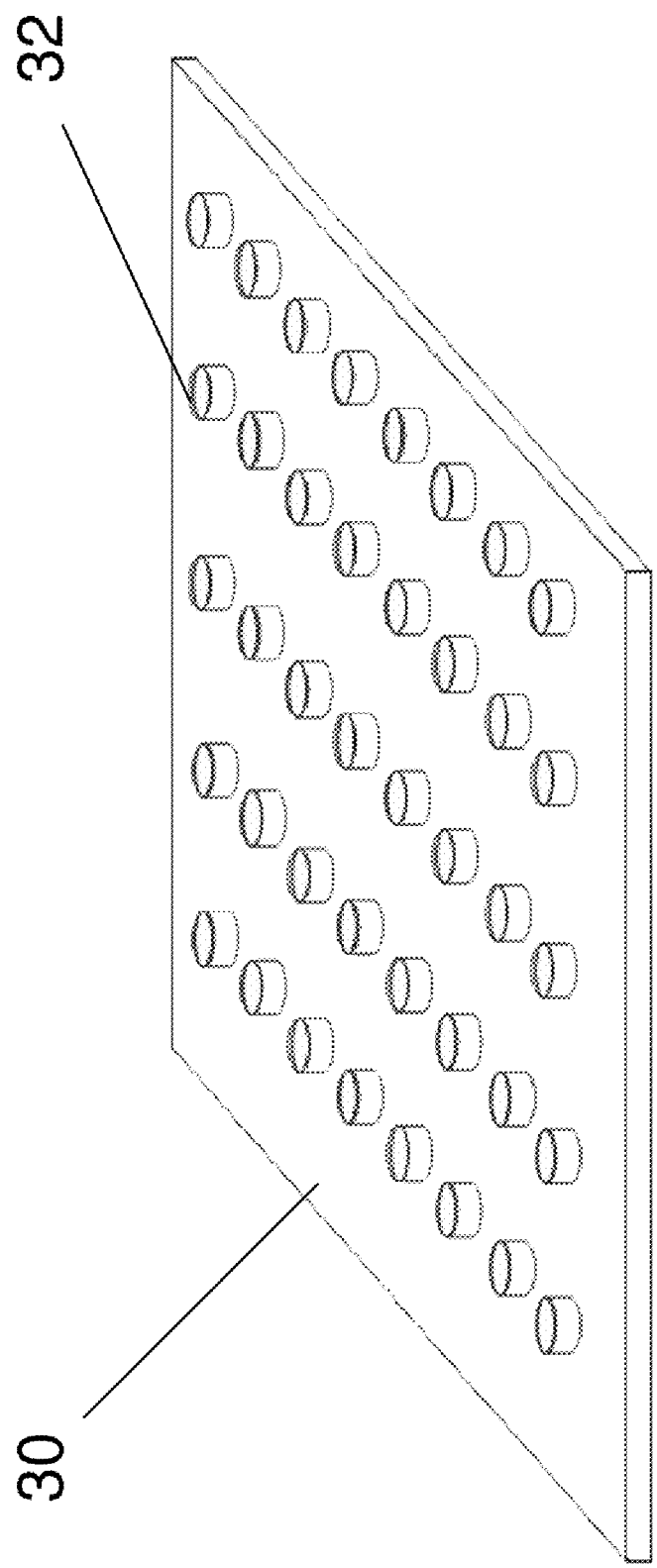
FIG. 2b is a schematic showing an exemplary configuration of an insulating layer.

An insulating layer (30) with a number of arrays of via holes (32) is then to be fixed onto the metal sheet (20). Referring to FIG. 2*b*, the via holes (32) on the insulating layer are arranged to align with the openings (22) of the first conductive layer (metal sheet) (20) to allow direct electrical access to the metal fingers (14) that interleave with those already connected to the underlying metal sheet (20).

Figure 2C:
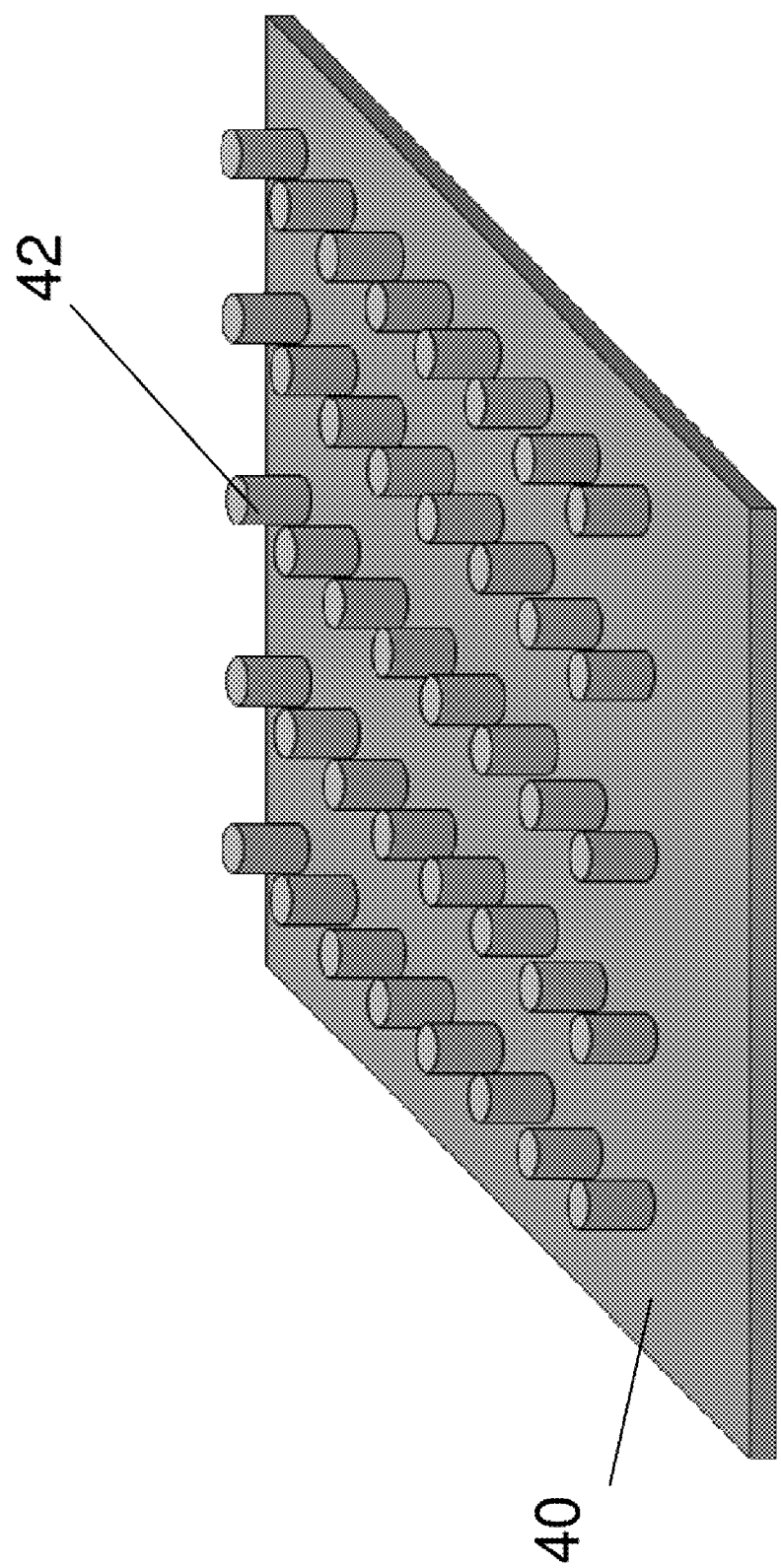
FIG. 2c is a schematic showing the arrangement of the connection pins on the second metal sheet with respect to the insulating layer.
Figure 3:
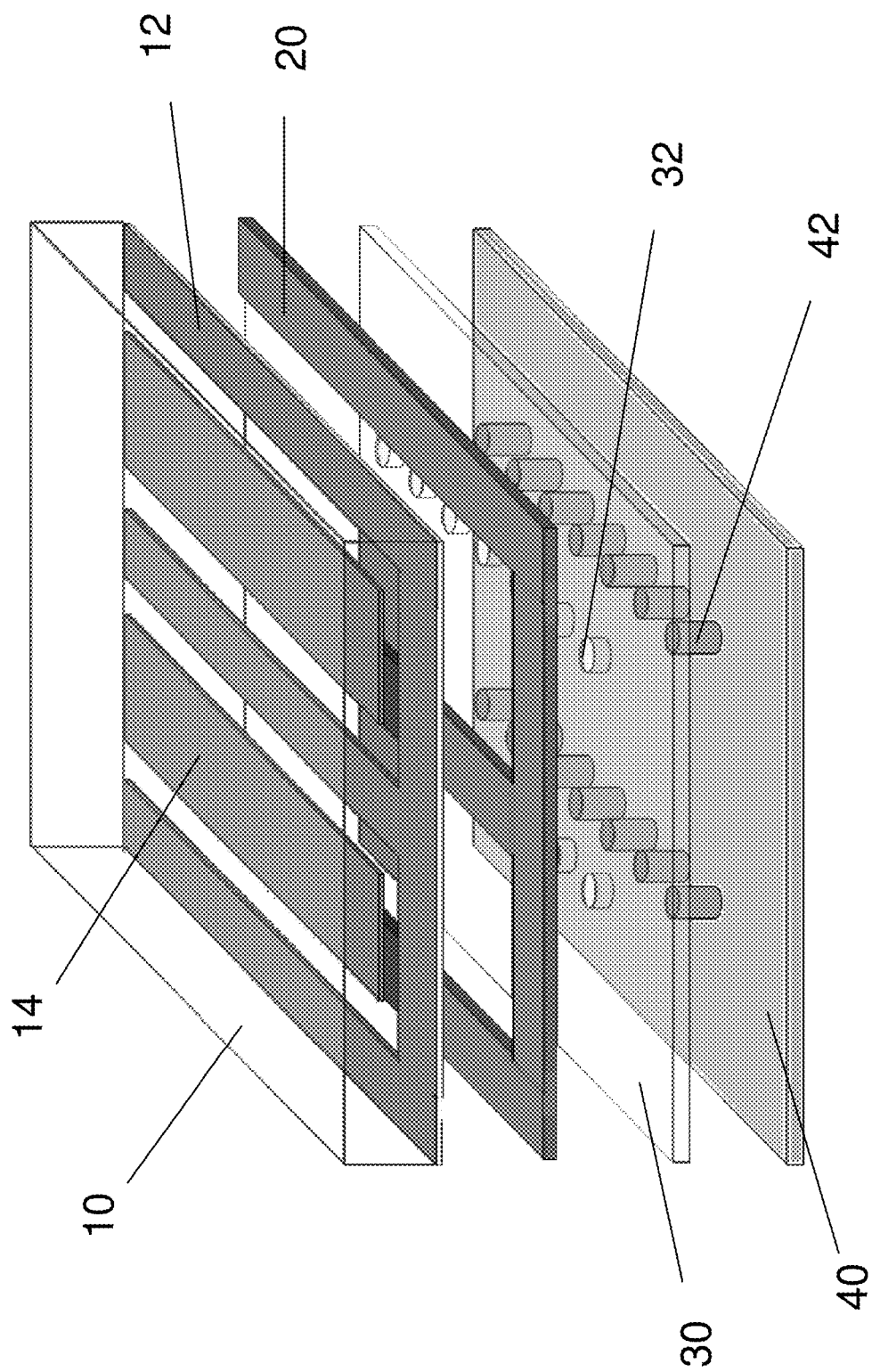
FIG. 3 is a schematic showing an exemplary assembly configuration for extracting more power out of a back-contact solar cell with two highly-conductive metal sheets and one insulating layer.

A second metal sheet (second conductive layer) (40) with a number of linear arrays of electrical connection pins (42), as shown in FIG. 2*c*, is then installed onto the insulating layer (30). The electrical connection pins (42) on the second metal sheet (40) are arranged to align exactly to those via holes (32) on the insulating layer (30). Once the second conductive layer (40) is positioned onto the insulating layer, as illustrated in FIG. 3, the connection pins (42) can easily, through the via holes (32) and the openings (22) of the first metal sheet (20), make firm and un-impinged contact with the metal fingers (14) of the cell (10).

These two metal layers (20 and 40) function as connection buses. With a great number of pin contact to the metal fingers (12 and 14) of a back-contact solar cell (10), photocurrent can be pulled immediately out of said cell (10) once photogenerated carriers reach its back contacts (12 and 14) of both polarities. In this way, the current flows vertically via the much shorter and thicker connection pins into highly-conductive metal sheets (20 and 40), rather than makes across-wafer flow through narrow, thin metal fingers to the buses on the edges of the cell. Therefore the energy loss associated with the metal finger sheet resistance may be significantly reduced.

Figure 4:
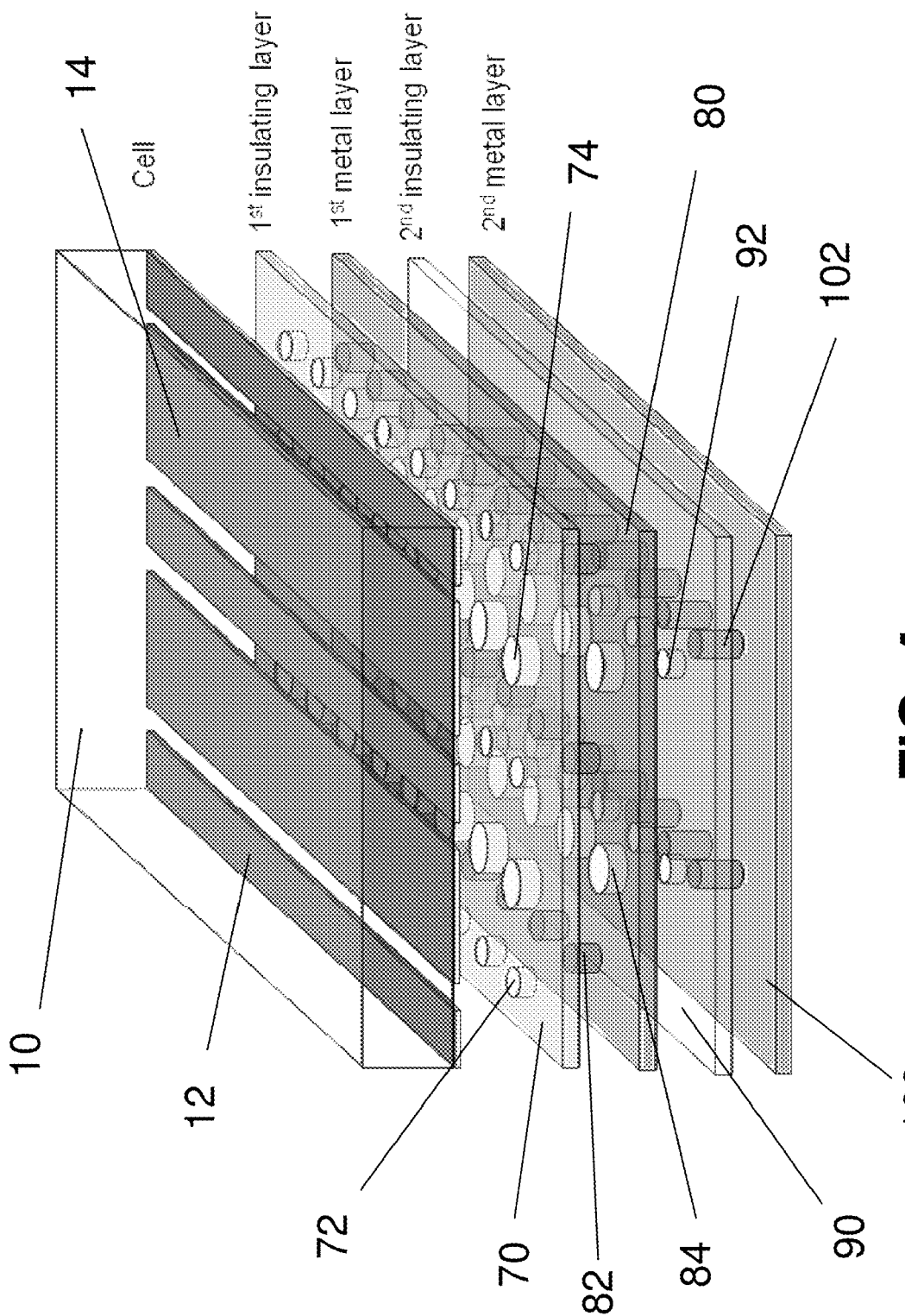
FIG. 4 is a schematic showing an exemplary assembly configuration for extracting more power out of a back-contact solar cell with two highly-conductive metal sheets and two insulating layers.
Figure 5A:
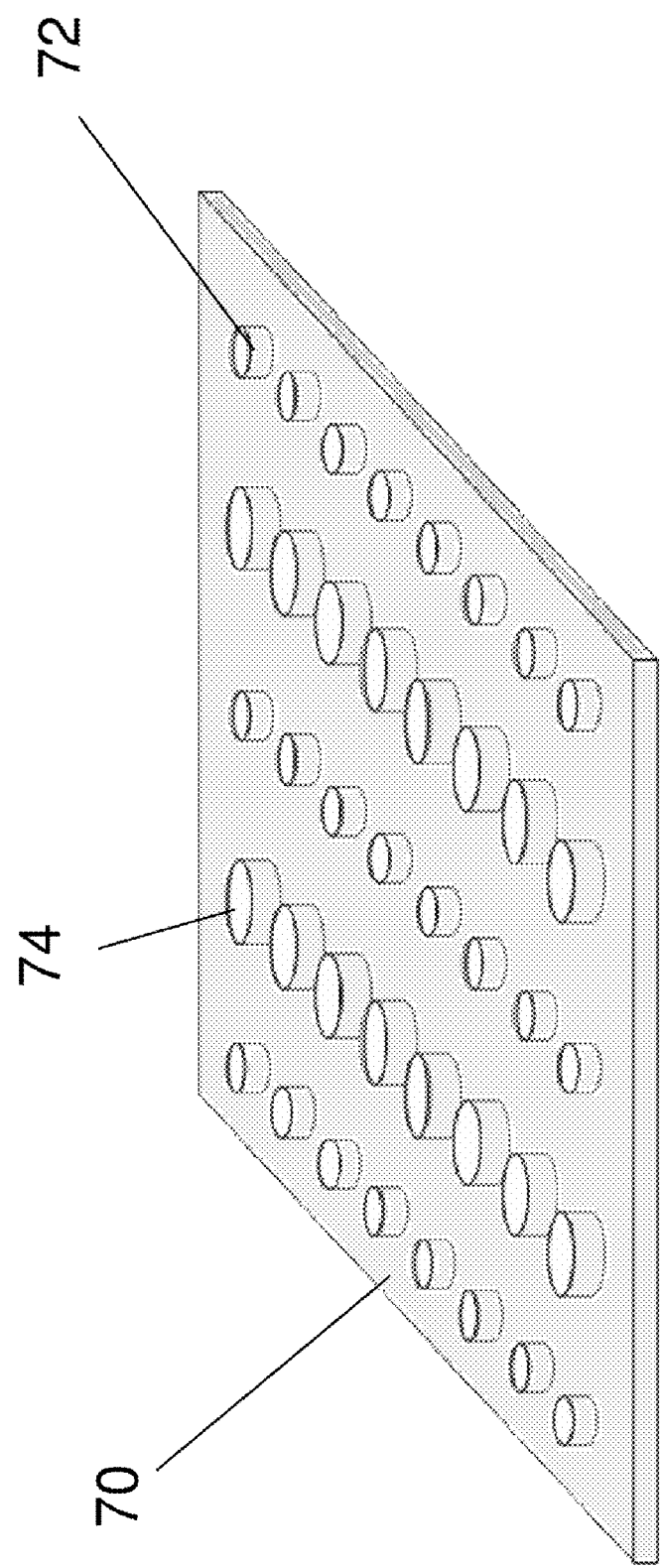
FIG. 5a is a schematic showing the first insulating layer with two sets of different size via holes.

In a further embodiment, a four-layer scheme, as illustrated in FIG. 4, may be used to maximize the electrical conduction of a solar cell (10) with interleaved contacts of both polarities (12 and 14) on its back surface (16). The first layer is an insulating sheet (first insulating layer) (70) that may be attached directly onto the back surface (16) of the solar cell (10). There are two sets of via hole (72 and 74) arrays of different sizes, as shown in FIG. 5*a*, on the first insulating sheet (70). These two sets of hole arrays are positioned on the sheet to make correspondent alignment with the two sets of metal fingers (12 and 14) on the cell's back surface (16).

Figure 5B:
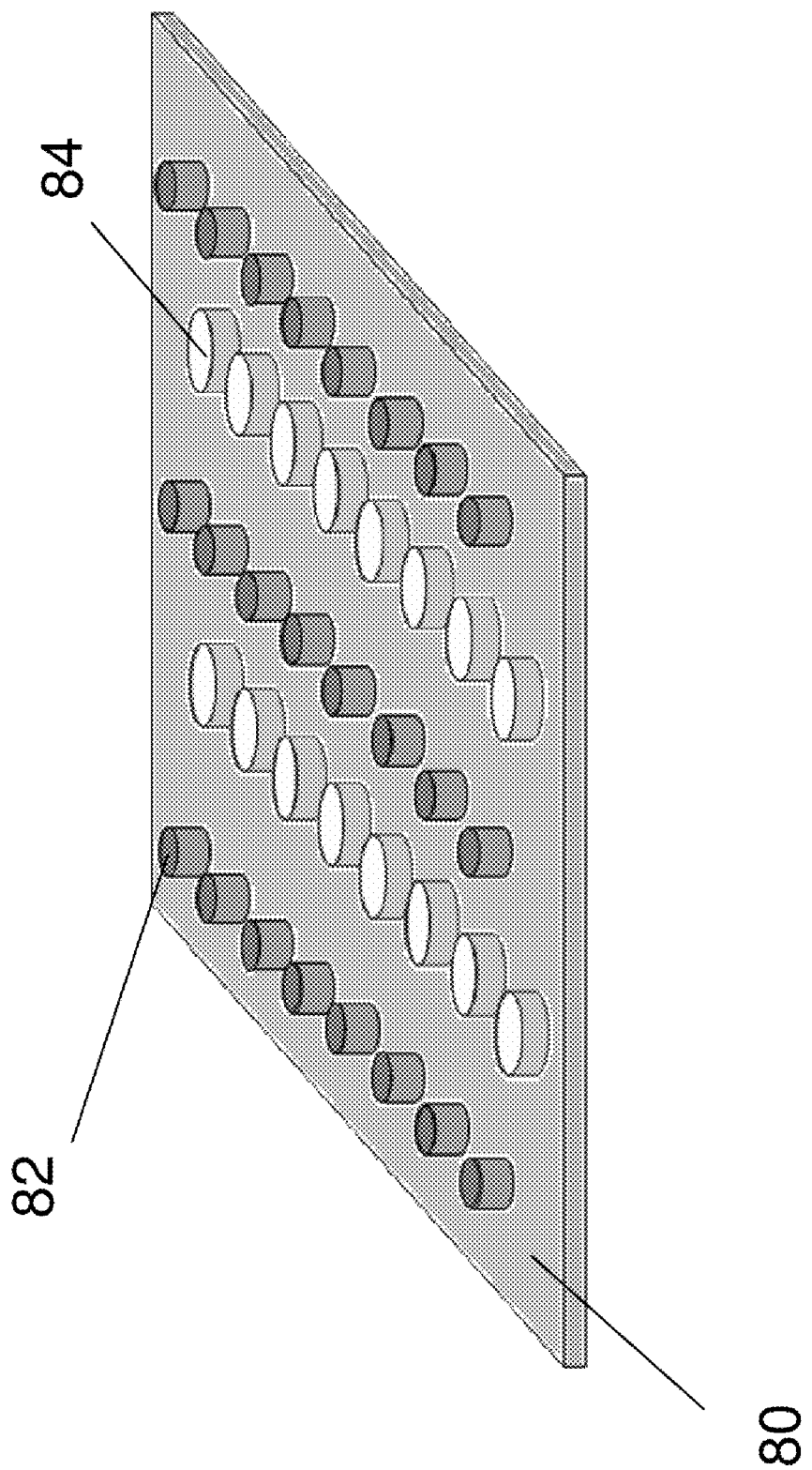
FIG. 5b is a schematic illustration of an exemplary example of the first metal sheet with interleaved linear arrays of connection pins and via holes.

The second layer is a metal sheet (first conductive layer) (80) which sits on top of the first insulating layer (70). There is one set of electrical connection pins (82) and one set of via holes (84) on this metal sheet (80), as illustrated in FIG. 5*b*. The connection pins (82) are made to have the same diameter and spatial position as those small-diameter via holes (72) on the underlying insulating layer (70) so that the pins may easily go through the insulating layer (70) to make excellent electrical contact to the metal fingers (12) on the cell (10). The via holes (84) on the metal sheet (80) are sized and positioned to be the same as those large-diameter holes (74) on the first insulating layer (70), allowing the via holes (74 and 84) on both sheets (70 and 80) be aligned with respect to each other exactly when the first metal sheet (80) is installed onto the first insulating layer (70).

Figure 5C:
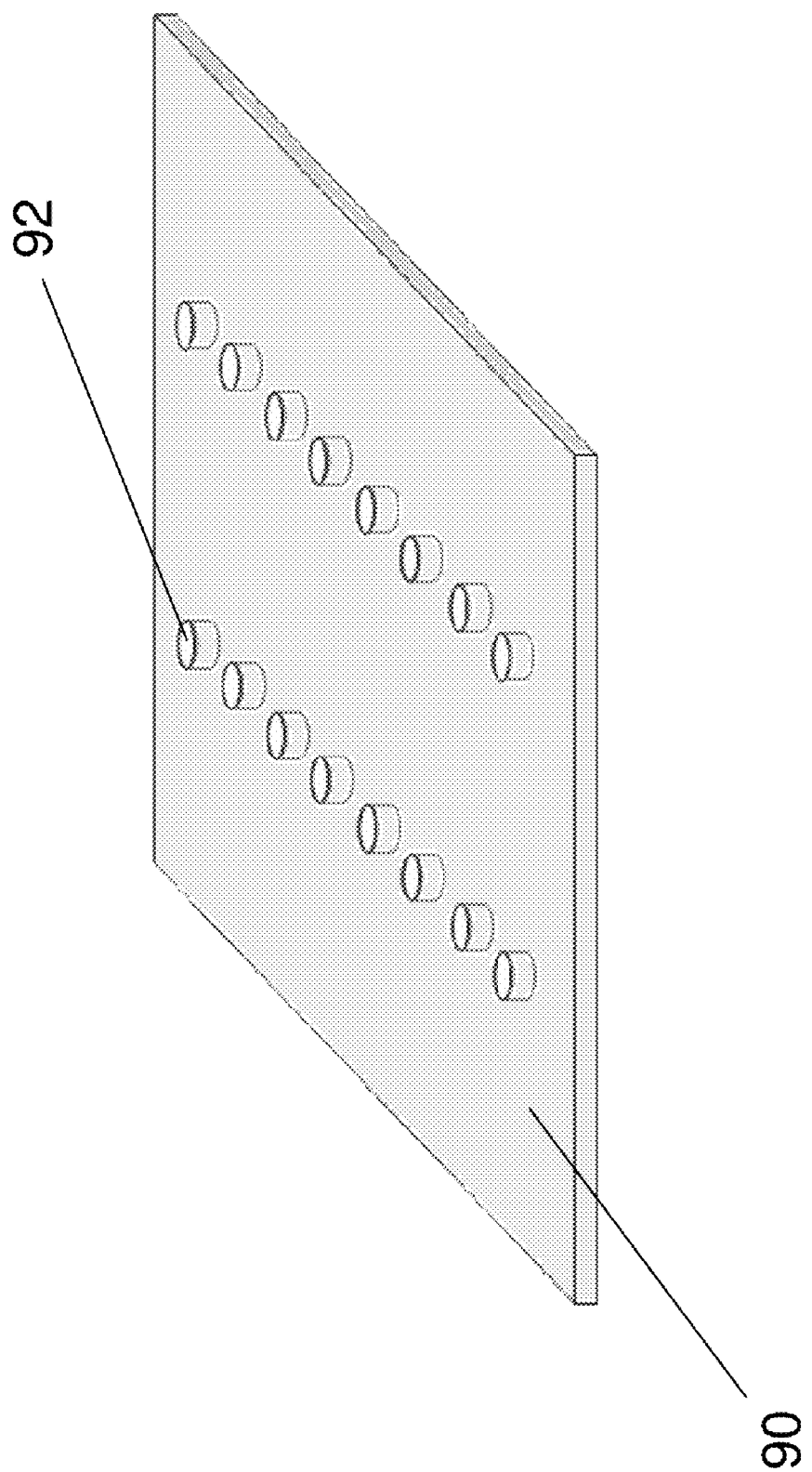
FIG. 5c is a schematic showing the via hole configuration on the second insulating layer.

The third layer is another insulating sheet (second insulating layer) (90) with one set of via hole (92) array, as shown in FIG. 5*c*. The via holes (92) on this sheet (90) are arranged to have the same pattern as those holes (84) on the first metal sheet (80) but preferably with a smaller size. The function of this layer (90) is to provide excellent insulation between the first and next conductive metal sheets (80 and 100).

Figure 5D:
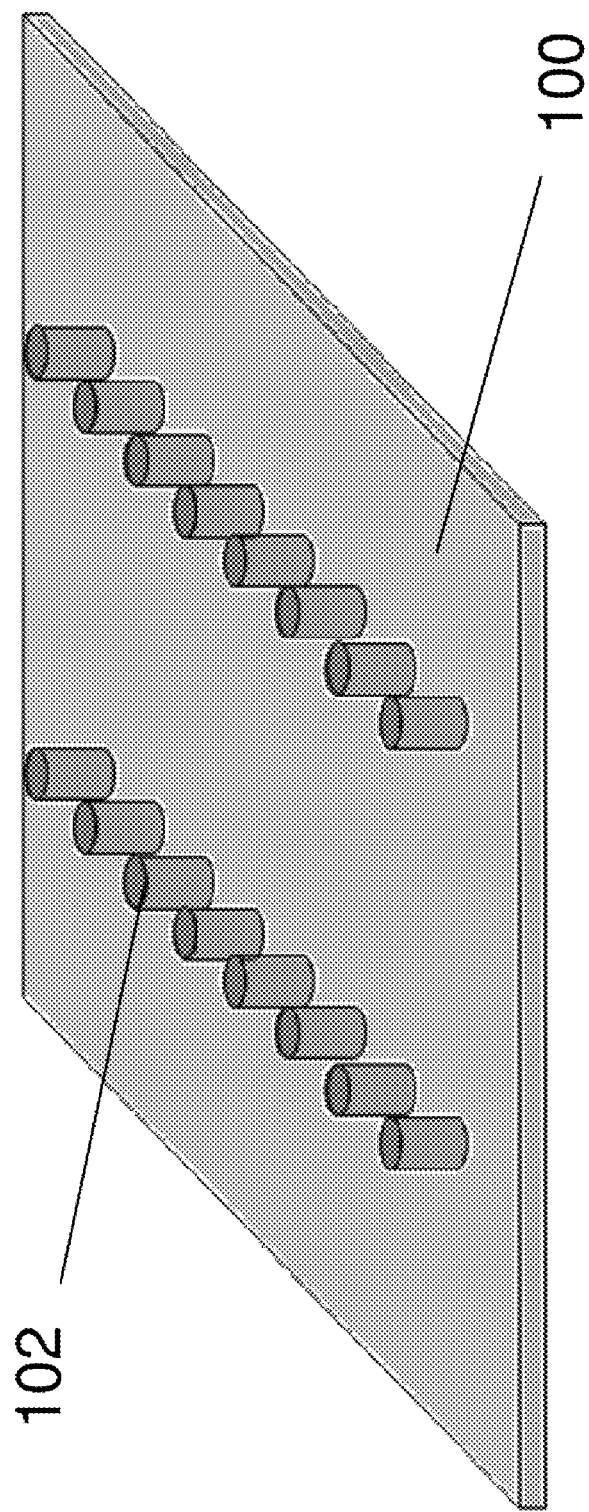
FIG. 5d is a schematic illustration of an exemplary example of the second metal sheet with linear arrays of connection pins.

The last layer is another metal sheet (second conductive layer) (100) with electrical connection pins (102) (see FIG. 5*d*). The positions of connection pins (102) on this metal sheet (100) are exactly the same as those via holes (92) on the second insulating layer (90) so that they can be fed through all three underlying layers (70, 80 and 90) to make firm and un-impinged point contact with the second set of metal fingers (14) with opposite polarity to the first set (12) of the cell (10).

Figure 6:
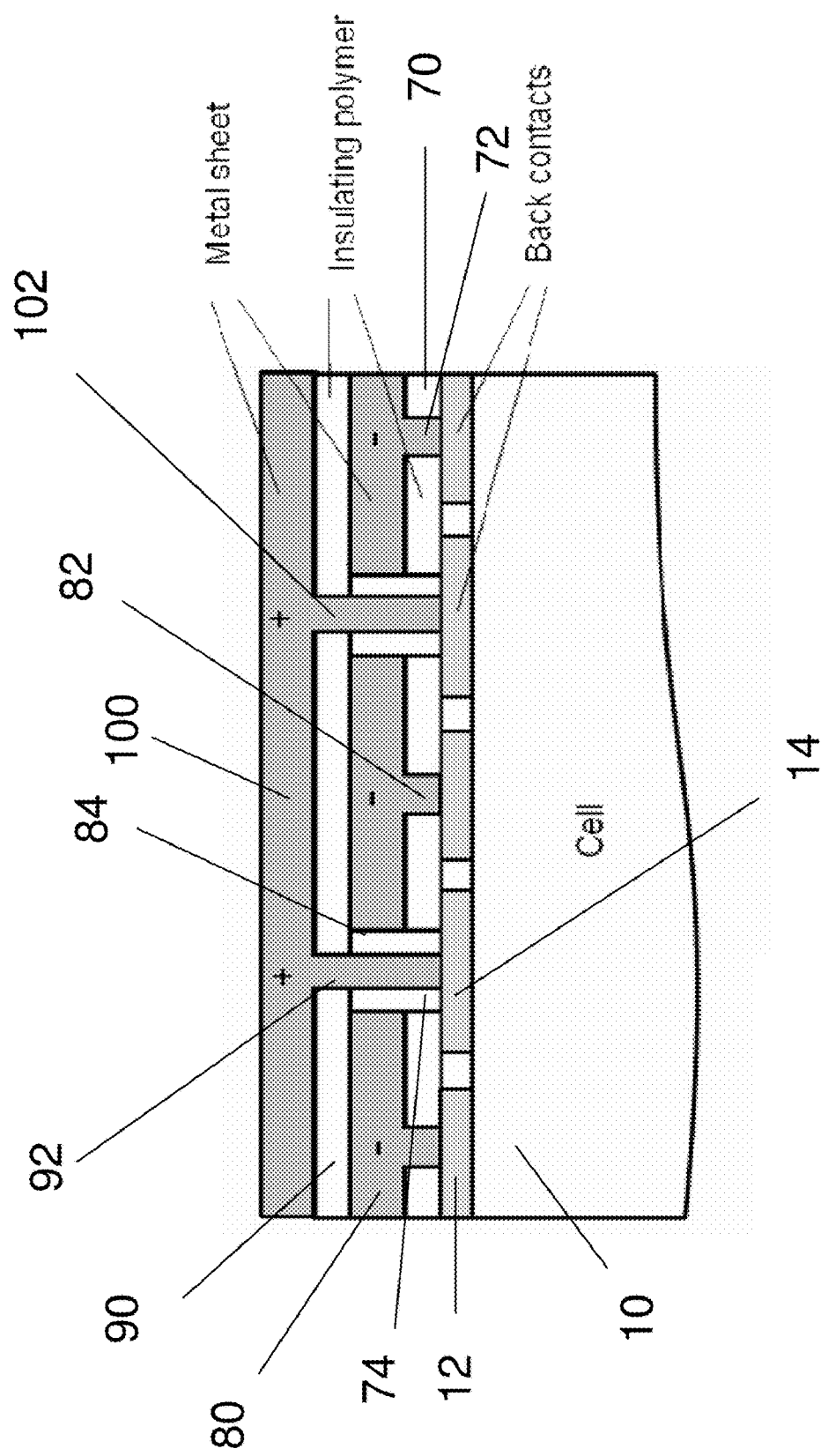
FIG. 6 is a cross-section view showing the exemplary assembly configuration for extracting more power out of a back-contact solar cell with two highly-conductive metal sheets and two insulating layers.

Shown in FIG. 6 is a schematic illustration of cross-section view for the finished assembly of the embodiment described above. The pinned contacts (82 and 102) from both metal sheets (80 and 100) to the metal fingers (12 and 14) of a back-contact cell (10) ensure excellent electrical conduction and provide a much less resistive pathway for current flowing out of the solar cell (10). The two metal sheets (80 and 100) act as connection buses, through numerous point contacts to the metal fingers (12 and 14), pulling current out immediately once the photogenerated carriers reach the back contacts (12 and 14) of both polarities on the cell (10). In this way, the long-distance across-wafer flow of current through the narrow, thin metal fingers can be avoided; therefore, the energy loss associated with the metal finger sheet resistance can be significantly reduced.

An additional novel feature of the present embodiments is that the large area of the metal sheets (80 and 100) may also be used to dissipate heat generated by sunlight. Heat may be quickly removed from solar cells that are attached through the large-area metal sheets.

Although certain embodiments and preferred embodiments of the invention have been specifically described herein, it will be apparent to those skilled in the art to which the invention pertains that variations and modifications of the various embodiments shown and described herein may be made without departing from the spirit and scope of the invention. Accordingly, it is intended that the invention be limited only to the extent required by the appended claims and the applicable rules of law.

What is claimed is:

1. A solar cell apparatus comprising:
    a back-contact solar cell having, on its back side, a first contact having a first polarity and a second contact having a second polarity, wherein said first contact comprises a plurality of fingers and said second contact comprises a plurality of fingers that interdigitate between the fingers of said first contact;
    a first conductive layer having planar finger shapes matching that of the first contact such that said first conductive layer has substantially the same size and shape fingers as the first contact, wherein the first conductive layer is positioned adjacent to the back side of the back-contact solar cell and substantially overlays and is in electrical contact with the first contact and not in electrical contact with said second contact;
    an insulating layer disposed on said first conductive layer covering the first conductive layer and having an array of via holes wherein said via holes are aligned over said second contact; and
    a second conductive layer disposed on said insulating layer so that said insulating layer is disposed between said first conductive layer and said second conductive layer, and wherein said second conductive layer comprises an array of electrical connecting pins that are aligned with and insert through said via holes and make electrical contact with said second contact.

2. The apparatus of claim 1, wherein each of the connecting pins of the second conductive layer has approximately the same diameter of each of the holes of the insulating layer.

3. The apparatus of claim 1, wherein the first and second conductive layers are made of metal.

4. The apparatus of claim 1, wherein the first conductive layer is made of a metal sheet cut to have the same shape as the first contact of the solar cell.

5. A method for making a solar cell apparatus comprising the steps of providing a back-contact solar cell having, on its back side, a first contact having a first polarity and a second contact having a second polarity, wherein said first contact comprises a plurality of fingers and said second contact comprises a plurality of fingers that interdigitate between the fingers of said first contact;
    providing a first conductive layer having planar finger shapes matching that of the first contact such that said first conductive layer has substantially the same size and shape fingers as the first contact;
    positioning the first conductive layer adjacent to the back side of the back-contact solar cell such that it substantially overlays and is in electrical contact with the first contact;
    providing a second conductive layer having an array of electrical connecting pins thereon;
    providing an insulating layer having an array of through holes matching the array of electrical connecting pins on the second conductive layer; and
    assembling the insulating layer between the first and second conductive layers such that the electrical connecting pins insert through the holes to make electrical contact with the second contact.

6. The method of claim 5, wherein each of the connecting pins of the second conductive layer has approximately the same diameter of each of the holes of the insulating layer.

7. The method of claim 5, wherein the first and second conductive layers are made of metal.

8. The method of claim 5, wherein the first conductive layer is made of a metal sheet cut to have the same shape as the first contact of the solar cell.

9. The method of claim 5, further comprising the step of using the first and second conductive layers as buses for conducting current from the solar cell.

* * * * *